United States Patent [19]

Birnholz et al.

[11] 4,050,772

[45] Sept. 27, 1977

[54] UNITARY SOCKET TERMINAL FOR ELECTRONIC CIRCUITS

[76] Inventors: Jean Birnholz; Pierre Couty, both of 1870 Monthey Valais, Monthey, Switzerland

[21] Appl. No.: 652,462

[22] Filed: Jan. 26, 1976

Related U.S. Application Data

[63] Continuation-in-part of Ser. No. 638,939, Dec. 8, 1975.

[30] Foreign Application Priority Data

May 21, 1975 Switzerland ........................ 6499/75

[51] Int. Cl.[2] .......................... H01R 9/12; H01R 9/14; H05K 1/12

[52] U.S. Cl. ............................. 339/220 R; 339/17 C; 339/258 A

[58] Field of Search ................... 339/17 R, 17 C, 217, 339/220, 256 R, 258 R

[56] References Cited

U.S. PATENT DOCUMENTS

| | | | |
|---|---|---|---|
| 3,187,298 | 6/1965 | Shannon | 339/17 R X |
| 3,784,965 | 1/1974 | Murphy | 339/258 R |

FOREIGN PATENT DOCUMENTS

| | | | |
|---|---|---|---|
| 404,505 | 1/1934 | United Kingdom | 339/220 T |

*Primary Examiner*—Roy Lake
*Assistant Examiner*—E. F. Desmond
*Attorney, Agent, or Firm*—Stoll and Stoll

[57] ABSTRACT

A unitary socket terminal for electronic circuits, said socket terminal having lead ingress guide means and internal lead gripping means. The guide means provides unimpeded ingress to the lead gripping means. The socket terminal may also be provided with external contact or terminal means.

6 Claims, 12 Drawing Figures

UNITARY SOCKET TERMINAL FOR ELECTRONIC CIRCUITS

CLAIM TO PRIORITY

Applicants claim the right of priority on the basis of their pending Swiss Patent Application No. 6499/75, filed by them on May 21, 1975.

Claim to Continuity

This application is a continuation-in-part of applicants' pending U.S. Pat. Application Ser. No. 638,939 filed Dec. 8, 1975.

BACKGROUND OF THE INVENTION

2. Field of the Invention

This invention relates to lead terminals, contacts and connectors for printed circuit boards and other electronic circuits and systems.

2. Prior Art

Socket terminals are well known to the art. They consist, essentially, of two components, one a socket holder mounted, for example, on a printed circuit board, and the other a socket which is mounted in the socket holder. The socket holder includes terminal or contact means and the socket is adapted to receive and hold a lead.

The basic problem to which the present invention is addressed resides in the guidance for a lead into the socket. In conventional socket designs, the socket is inserted in its entirety into the socket holder and the upper end of the socket holder projects beyond the upper end of the socket. The upper ends of both the socket and socket holder are beveled and, to provide unimpeded entry of a lead into the socket, it is necessary to register these beveled ends to form a smooth, continuous surface. Such registration is not, however, always achieved, as when the socket is inserted too deeply into the socket holder or not deeply enough. In either case, a shoulder is formed between the beveled ends and tends to obstruct entry of a lead into the socket.

The socket terminal of applicants' pending United States Patent Application is conventional in the sense that it comprises a socket and a socket holder, the socket having means to engage a lead, and the socket holder having a terminal or contact means. It is also conventional in the sense that the socket is held within the socket holder. But where it departs from the prior art is in the configuration of the socket and its position relative to the socket holder.

Unlike the conventional socket, the socket of applicants' pending United States Patent Application is provided with an exposed head which effectively covers the outer (upper) end of the socket holder. This exposed head has a generally funnel-shaped orifice formed therein which communicates with the socket body and provides smooth, unimpeded entry of a lead into the socket body. No part of the socket holder impedes entry of the lead into the socket body.

It follows that the problem of impeded ingress was solved by the invention of applicants' pending United States Patent Application, but, as above stated, said invention still requires both a socket and a socket holder, neither capable of functioning without the other.

This is not objectionable in most applications, but in some instances only a socket is needed for the circuit, and in such cases the socket holder serves, essentially, only as a receptacle for the socket.

Where the circuit requires both a socket connection for a lead and a contact or terminal for another conductor or component, the use of both a socket and a socket holder (with a contact or terminal appendage) is, of course, entirely suitable for the application. However, by definition, the socket and socket terminal of the prior art are two elements which must be interlocked, and this makes for a relatively costly device in terms of both material and labor.

SUMMARY OF THE INVENTION

The present invention provides a unitary socket terminal consisting of a socket which may be used without a socket holder, lead gripping means within the socket, and lead guidance means at the socket inlet, said lead gripping means and said lead guidance means being integral parts of the socket. Stated differently, the inlet end of the socket is formed with lead guidance means and the opposite end of the socket is formed with lead gripping means.

The socket terminal of the present invention may itself be lodged in a borehole formed in a printed circuit board or in any other conventional receptacle for conventional socket terminals. The present socket is provided externally with anchoring means engageable with the borehole wall to prevent accidental or unintentional displacement of the socket from the borehole. No socket holder is required to seat or hold the socket in the borehole. There is, accordingly, a saving in material (a unitary socket terminal is less costly than a conventional two-piece socket terminal) and in labor (a unitary socket terminal is less to install than a conventional two-piece socket terminal).

For installations requiring multiple contacts or connections, the present invention provides a unitary socket terminal which has a contact or terminal formation formed thereon at the end opposite the inlet end. This contact or terminal formation is also integral with the socket and, again, a one-piece socket terminal in accordance with the present invention takes the place of a conventional two-piece construction.

DESCRIPTION OF PREFERRED EMBODIMENTS OF THE INVENTION

Figure 1:
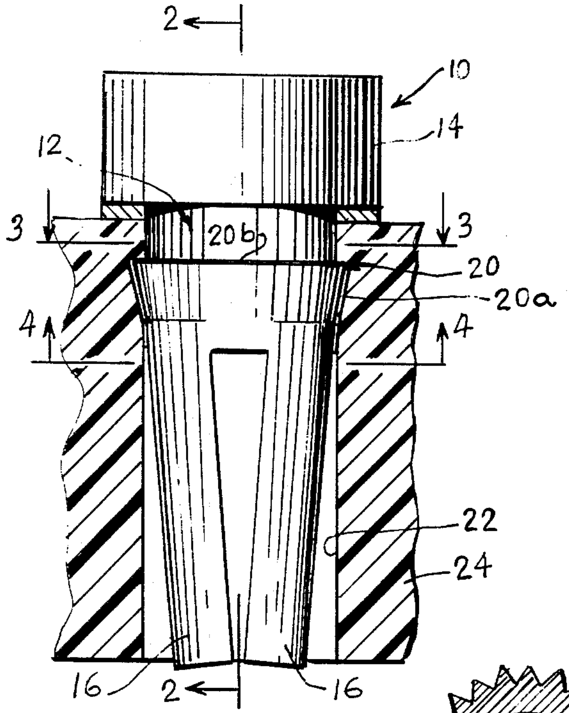
FIG. 1 is a side view of a unitary socket terminal showing it mounted in a borehole formed in a printed circuit board, the board being shown in fragmentary, sectional view.
Figure 2:
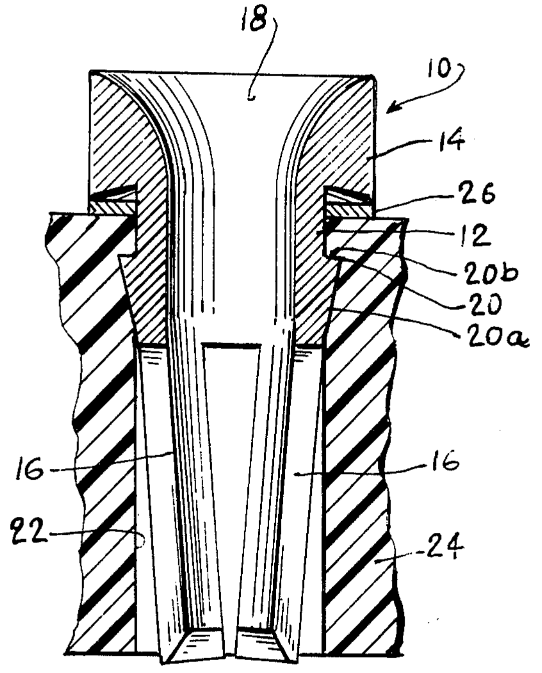
FIG. 2 is a longitudinal section through said unitary socket terminal, said section taken on the line 2—2 of FIG. 1.

Referring now to the basic form of the invention as illustrated in FIGS. 1–4, it will be seen that unitary socket terminal 10 consists of a tubular body 12, an open-ended head 14 integral with the upper, inlet end of tubular body 12, and lead-gripping means 16 integral with the lower end of said tubular body. In the illustrated form of the invention, the lead-gripping means 16 comprises a plurality of circumferentially disposed spring fingers which are equally spaced from each other and from the longitudinal axis of the tubular body 12.

Open-ended head 14 has a generally funnel-shaped orifice 18 which extends axially therethrough. Tubular body 12 defines a generally cylindrical chamber 32 which is in coaxial communication with the funnel-shaped orifice to receive a lead. The annular walls which define said orifice and said chamber are smoothly continuous with each other and they function as guide surfaces to guide a lead into engagement with the spring fingers.

Funnel-shaped orifice 18 is a basic configuration which is illustrative of the various funnel shapes that are encompassed within the present invention. Orifice 18 has a tapered annular wall of compound curvature which may be described as horn-shaped or flared bell-shaped. More precisely, said orifice defines a surface generated by a curve such as a parabolic curve rotated about the longitudinal axis of the tubular body 12. In the precise configuration shown, in longitudinal section, a curve having a radius of 0.036 inches defines the wall of orifice 18, and said wall merges in a smooth continuous curve with the inner wall of tubular body 12. In the same precise configuration, the inner diameter of said tubular body, this being the diameter of its inner cylindrical chamber, is 0.028 inches. This precise configuration and these precise specifications are, of course, purely illustrative of the invention, and not intended as any limitation thereof.

It will also be noted that an annular rib 20 encircles the outer wall of tubular body 12, said annular rib being integral with said tubular body. This rib, in a section extending longitudinally of the tubular body, has a tapered outer surface 20*a* and a square top shoulder 20*b*, said tapered surface rising upwardly out of the outer wall of the tubular body and meeting the top shoulder at an acute angle. The result is a relatively sharp-edged rib which is engageable with the wall that defines borehole 22 in printed circuit circuit board 24 in which the socket terminal is lodged. As will be understood, the socket terminal is made of metal, and the board is made of plastics, the metal being a harder material than the plastics, and, consequently, annular rib 20 forms and occupies a complementary incision or depression in the borehole wall. The annular rib thereby secures the socket terminal to the printed circuit board.

It will be observed in the drawing (FIGS. 1 and 2) that annular head 14 is adapted to contact an element 26 of the printed circuit on the board. This is a method of providing contact between the socket terminal and its lead on the one hand, and the printed circuit on the other hand.

Figure 7:
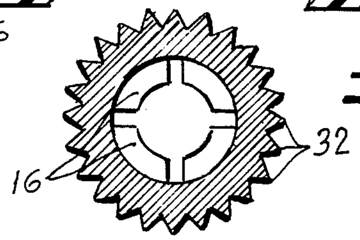
FIG. 7 is a transverse section on the line 7—7 of FIG. 5.
Figure 3:
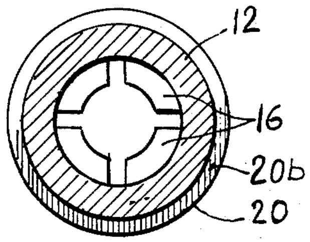
FIG. 3 is a transverse section on the line 3—3 of FIG. 1.
Figure 5:
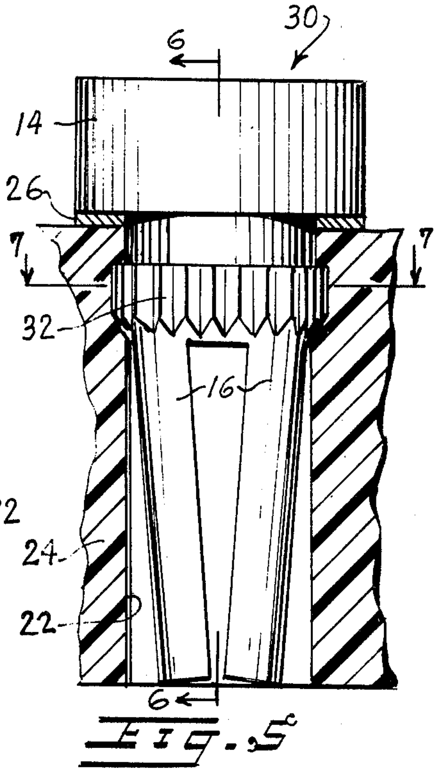
FIG. 5 is a view similar to that of FIG. 1 but showing a modified form of the invention. 1
Figure 4:
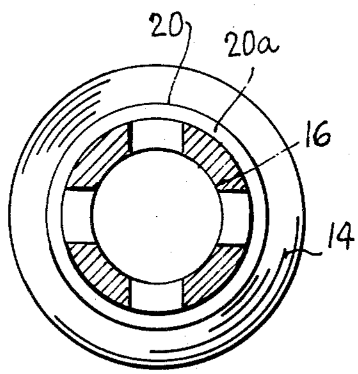
FIG. 4 is a transverse section on the line 4—4 of FIG. 1.
Figure 6:
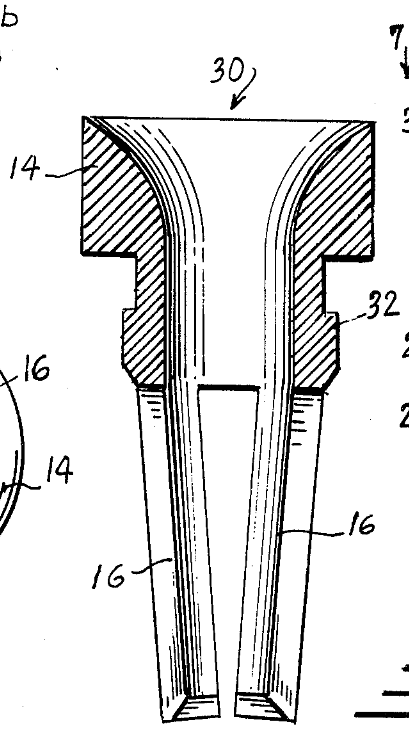
FIG. 6 is a longitudinal section through the modified unitary socket terminal, said section being taken on the line 6—6 of FIG. 5.
Figure 8:
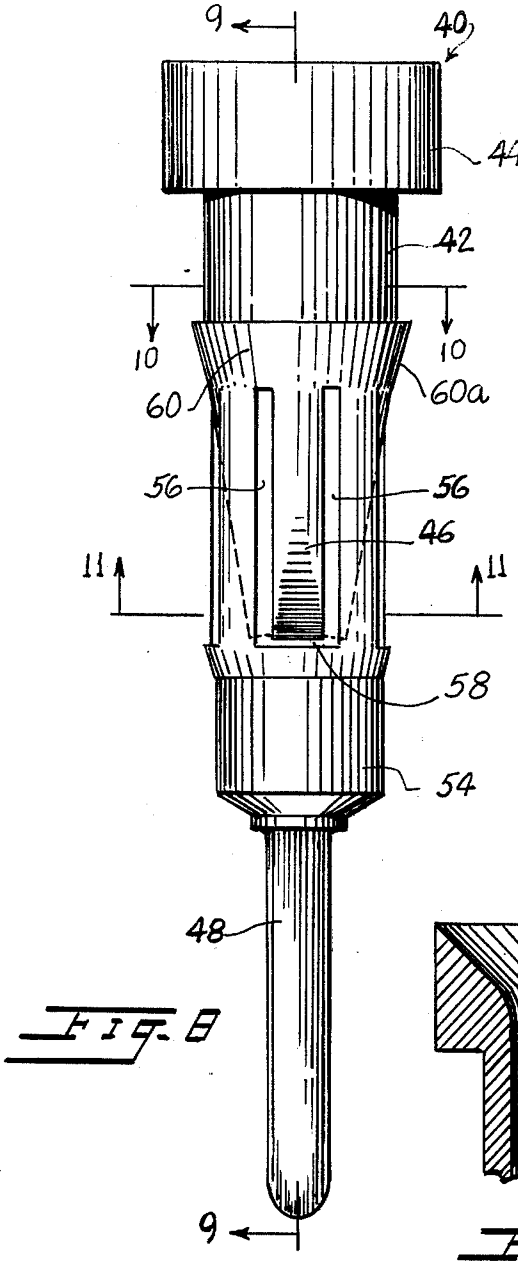
FIG. 8 is a side view of a unitary socket terminal made in accordance with a further modification of the invention, showing the socket provided with a contact or terminal opposite its inlet end.
Figure 9:
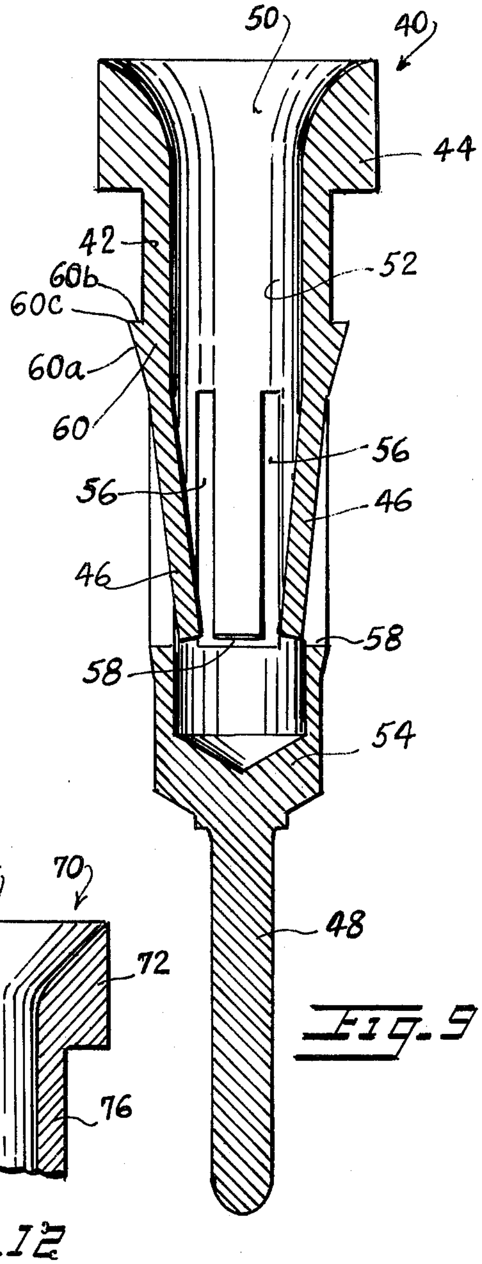
FIG. 9 is a longitudinal section on the line 9—9 of FIG. 8.

Referring now to the modification shown in FIGS. 5–7, it will be understood that socket terminal 30 has the same construction and configuration as socket terminal 10 except for the means for securing the socket terminal to the printed circuit board. In the place and stead of annular rib 20, socket terminal 30 is provided with a plurality of serrations which encircle the tubular body. More precisely, parallel serrations 32 extend longitudinally of tubular body 34, their lower ends 32*a* being beveled and their upper ends 32*b* defining square shoulders. The beveled ends of the serrations enable the socket terminal to be forced into the borehole 22 in printed circuit board 24; the square shoulders define relatively sharp ends which tend to dig into the borehole wall to hold the socket terminal in place. This is clearly shown in FIG. 5.

Turning now to a further modification of the invention as shown in FIGS. 8–11, it will be observed that unitary socket terminal 40 comprises a tubular body 42, an open-ended head 44 at the upper end of the tubular body, lead gripping means 46 projecting radially inwardly from said tubular body, and a contact element or terminal 48 projecting downwardly from said tubular body.

Open-ended head 44 corresponds to the open-ended heads of socket terminals 10 and 30. It is provided with a funnel-shaped orifice 50 which communicates with cylindrical chamber 52 in tubular body 42, the compoundly curved wall which defines said orifice merging smoothly with the cylindrical wall which defines said cylindrical chamber, thereby forming a continuous lead-guiding surface.

It will be noted that tubular body 42 is open only at its upper end to communicate with orifice 50. The lower end 54 of the tubular body is closed, forming a base or support for contact element or terminal 48. The cylindrical wall which comprises the tubular body is slit both longitudinally and transversely to form longitudinally extending fingers, and these fingers are bent radially inwardly to form lead-gripping means 46. Specifically, each finger is defined by a pair of longitudinal slits 56 and a transverse slit 58 which joins said longitudinal slits at their lower ends.

Tubular body 42, like tubular body 12, is provided with an outwardly extending annular rib 60 which is tapered on its downwardly facing side 60*a* and is provided with a square shoulder 60*b* on its upper side. A relatively sharp edge 60*c* is thereby formed on rib 60 which engages the wall of a borehole in a printed circuit board to secure the socket terminal therein. If desired, serrations such as serrations 32 may be substituted for annular rib 60.

Figure 12:
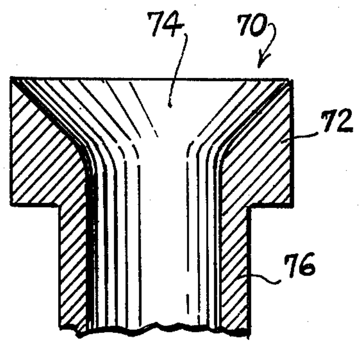
FIG. 12 is a fragmentary longitudinal section showing another modification of the invention.
Figure 10:
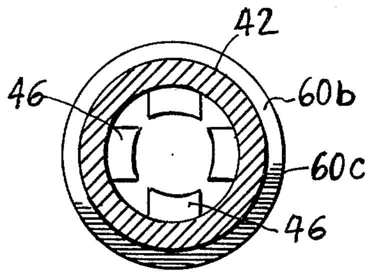
FIG. 10 is a transverse section on the line 10—10 of FIG. 8.
Figure 11:
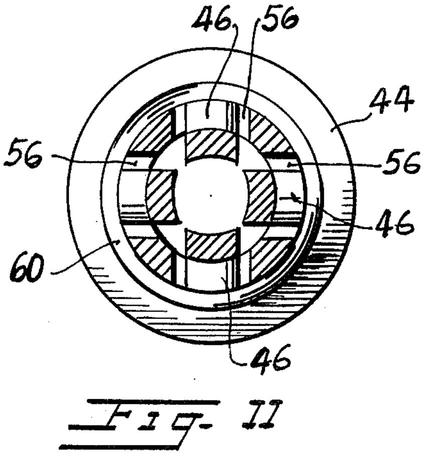
FIG. 11 is a transverse section on the line 11—11 of FIG. 8.

Referring to FIG. 12, it will be seen that the modified unitary socket terminal 70 shown therein differs from the socket terminals shown in FIGS. 1–11 in that open-ended head 72 has a funnel-shaped orifice formed therein which is defined by a conically-tapered wall. This wall, like the walls defining the previously described funnel-shaped orifices, curves downwardly to merge smoothly with the inner cylindrical wall of tubular body 76. A continuous lead-guiding surface is thereby formed.

The foregoing description is intended to be illustrative of the invention and not to limit it except as limited by the appended claims. Thus, the invention does not limit or define the manner or method of forming the lead-gripping means 46 in socket terminal 40. Such means may be produced by punching and forming or by any other suitable method. Also, the invention is not limited to the precise type of contact element or terminal (element 48) shown in the drawing. Any other conventional form of contact element or terminal may be used. Nor is the invention limited to the use of annular ribs 20 and 60 or serrations 32 as the means for securing the socket terminal in a borehole in a printed circuit board. Any suitable and conventional holding means may be used.

We claim:

1. A unitary socket terminal for electronic circuits and connections, comprising:

a. a cylindrical tubular body having a circumferentially continuous inner wall which defines a cylindrical inner chamber, b. a cylindrical tubular head, larger in diameter than the tubular body, formed at the upper end of said tubular body, c. said tubular head having a circumferentially continuous inner wall which defines a funnel-shaped orifice whose smaller end communicates with said inner chamber, d. said inner wall in said tubular head curving smoothly into said inner wall in the tubular body to form a continuous lead-guiding surface, e. a downwardly facing annular shoulder formed on said tubular head, f. said annular shoulder being adapted to engage a circuit or connecting element which encircles the tubular body, and g. lead-gripping means formed at the lower end of the tubular body to engage a lead guided thereinto.

2. A unitary socket terminal in accordance with claim 1, wherein:

the orifice in the tubular head has a horn-shape configuration generated by a curve rotated about the longitudinal axis of the tubular body.

3. A unitary socket terminal in accordance with claim 1, wherein:

the orifice in the tubular head has a conical configuration coaxial with the tubular body.

4. A unitary socket terminal in accordance with claim 1, wherein:

a. a contact terminal is formed at the lower end of the tubular body, b. said contact terminal extending downwardly from said tubular body, coaxially therewith.

5. A unitary socket terminal in accordance with claim 1, wherein:

a. means for securing the socket terminal to a borehole wall formed in a printed circuit board is provided on the outer wall of the tubular body, b. said securing means comprising at least one annular rib formed on the outer wall of the tubular body, extending longitudinally of said tubular body, c. said annular rib having a downwardly facing tapered surface and an upwardly facing square shoulder and a relatively sharp edge between said downwardly and upwardly facing surfaces, d. said sharp edge being adapted to engage said borehole wall to secure the socket terminal in said borehole.

6. A unitary socket terminal in accordance with claim 1, wherein:

a. means for securing the socket terminal to a borehole wall formed in a printed circuit board is provided on the outer wall of the tubular body, b. said securing means comprising a plurality of serrations formed on the outer wall of the tubular body, c. said serrations extending longitudinally of the tubular body and having downwardly facing tapered ends, upwardly facing square ends, and relatively sharp points defined by said square ends, d. said sharp points being adapted to engage said borehold wall to secure the socket terminal in said borehole.

* * * * *